US006743669B1

(12) United States Patent
Lin et al.

(10) Patent No.: US 6,743,669 B1
(45) Date of Patent: Jun. 1, 2004

(54) METHOD OF REDUCING LEAKAGE USING SI₃N₄ OR SION BLOCK DIELECTRIC FILMS

(75) Inventors: Hong Lin, Vancouver, WA (US); Shiqun Gu, Vancouver, WA (US); Peter McGrath, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/164,227

(22) Filed: Jun. 5, 2002

(51) Int. Cl.⁷ ................. H01L 21/8234; H01L 21/8244
(52) U.S. Cl. ....................... 438/238; 438/210; 438/382
(58) Field of Search ................ 438/210, 238, 438/382, 592

(56) References Cited

U.S. PATENT DOCUMENTS

| | | | | |
|---|---|---|---|---|
| 6,020,242 A | * | 2/2000 | Tsai et al. .................. 438/279 |
| 6,143,613 A | * | 11/2000 | Lin ............................. 438/299 |
| 6,225,155 B1 | * | 5/2001 | Lin et al. .................... 438/238 |
| 6,348,389 B1 | * | 2/2002 | Chou et al. ................. 438/305 |
| 6,458,702 B1 | * | 10/2002 | Aloni ......................... 438/682 |
| 6,479,317 B2 | * | 11/2002 | Chen et al. ................... 438/72 |

* cited by examiner

Primary Examiner—Amir Zarabian
Assistant Examiner—Jamie L. Brophy
(74) Attorney, Agent, or Firm—Beyer Weaver & Thomas, LLP

(57) ABSTRACT

A dielectric film block is used in semiconductor processing to protect selected areas of the wafer from silicidation. The selected areas may include resistors. A first layer of oxide is formed on the resistor and a second layer comprising SiON or Si₃N₄ is disposed on the oxide. A mask is patterned to allow etching to take place in the areas where silicide formation is desired. The oxide layer serves as an etch stop layer during etching of the second layer.

19 Claims, 4 Drawing Sheets

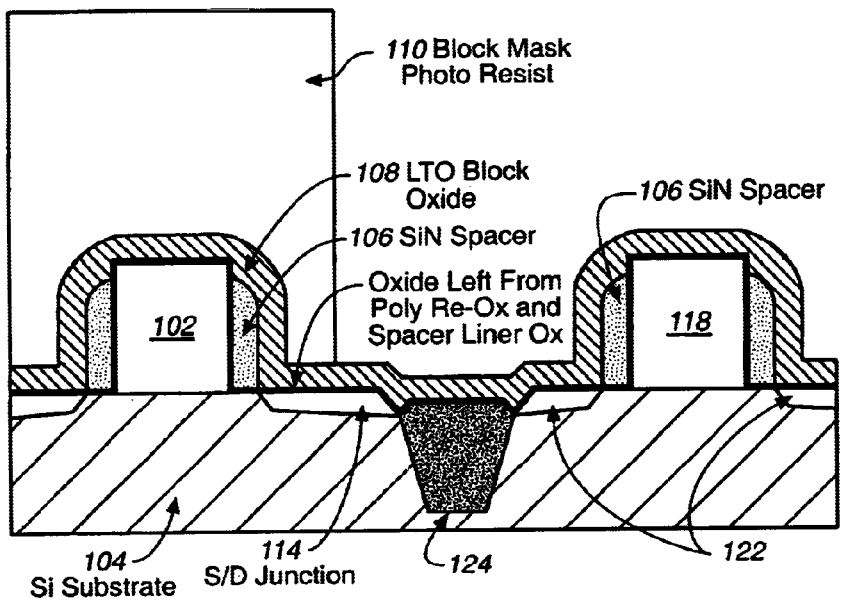
FIG._1A
(PRIOR ART)
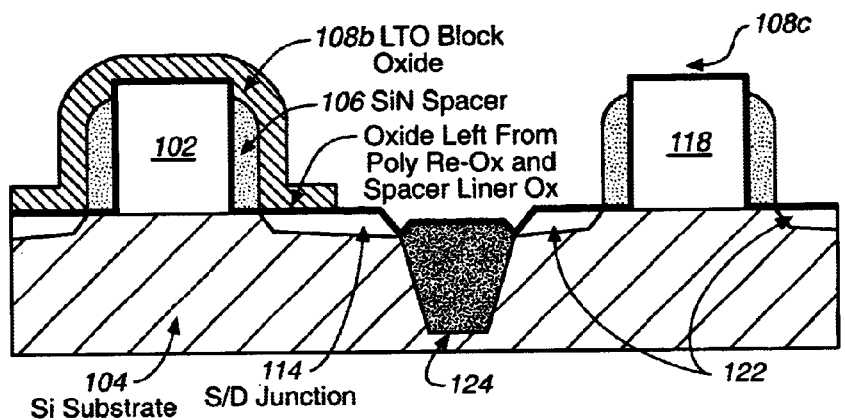
FIG._1B
(PRIOR ART)
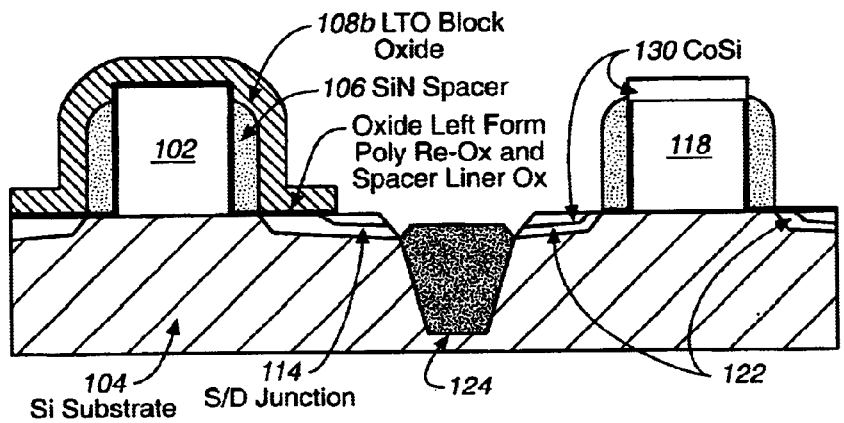
FIG._1C
(PRIOR ART)

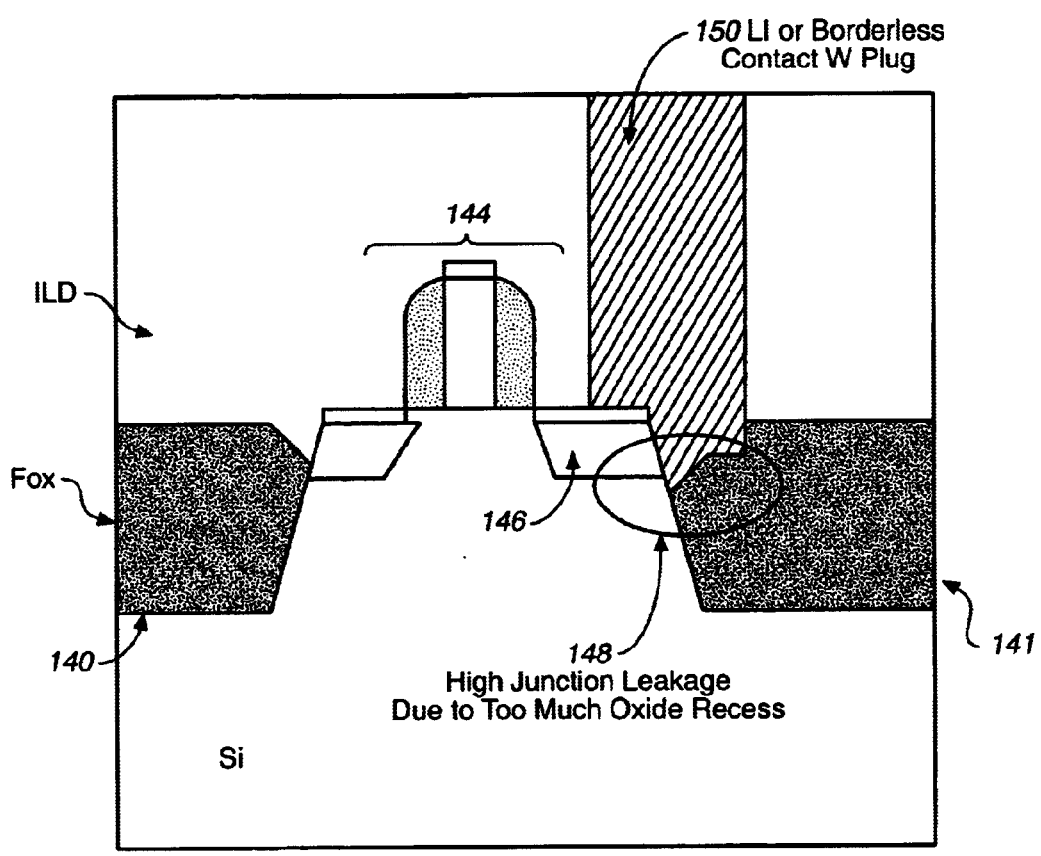
FIG._1D (PRIOR ART)

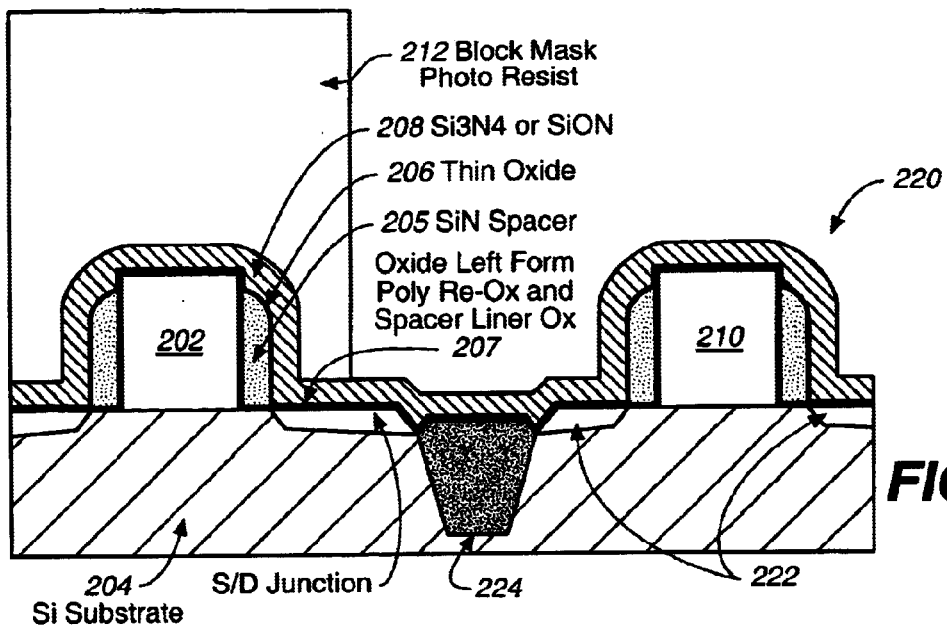
FIG._2A
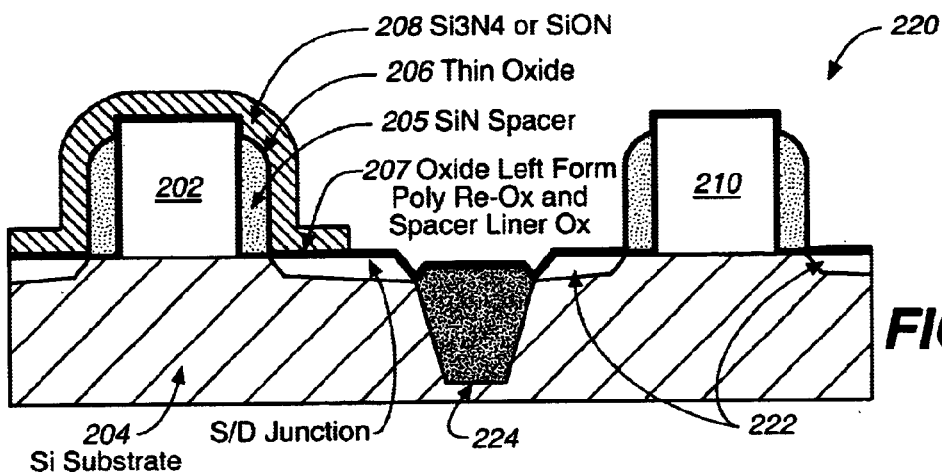
FIG._2B
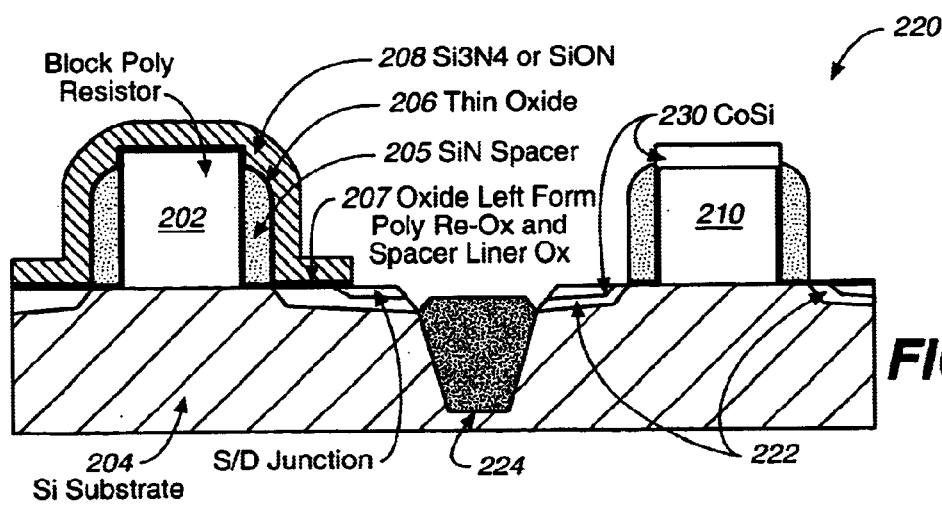
FIG._2C

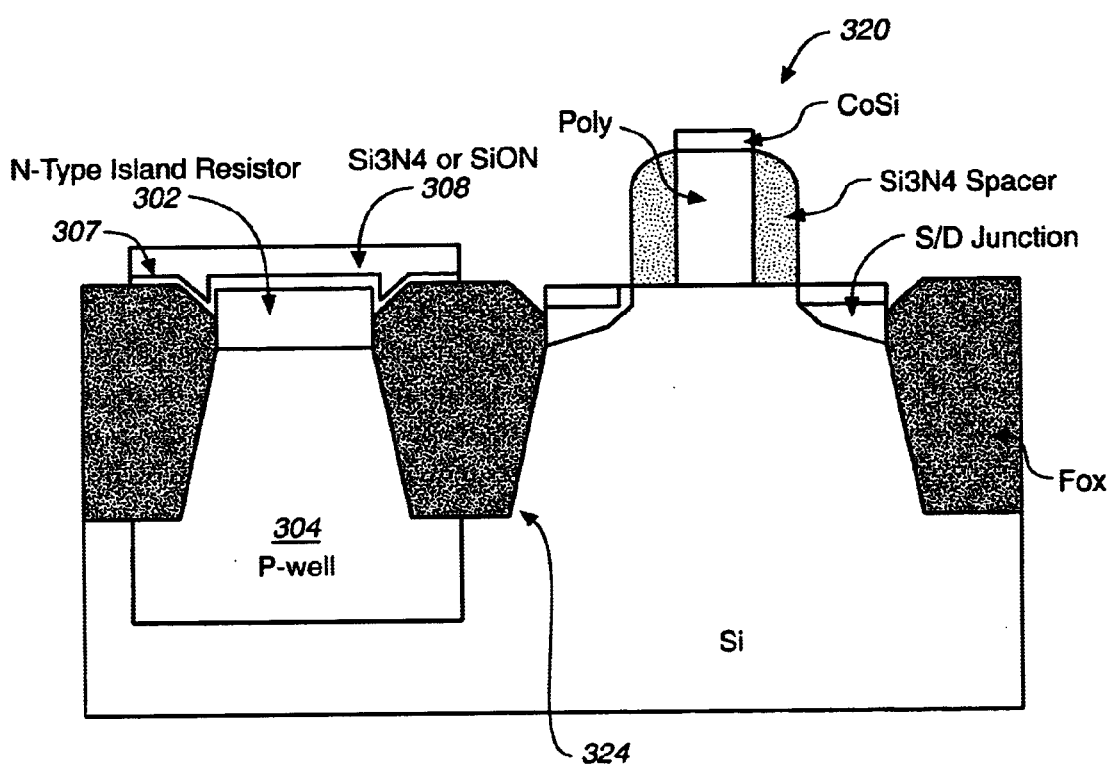
FIG._3

METHOD OF REDUCING LEAKAGE USING $Si_3N_4$ OR SiON BLOCK DIELECTRIC FILMS

BACKGROUND OF THE INVENTION

1. Field of the Invention

The present invention relates to processes for forming dielectric film blocks over resistor areas during semiconductor manufacturing. More particularly, the present invention relates to the use of block dielectric layers over selected poly and island resistors to prevent silicidation.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

One of the common additional operations involves the reduction of interconnect resistance. A self-aligned silicide (salicide) operation provides low resistance source drain connections as well as low-resistance polysilicon contact areas. In conventional CMOS processing, salicided metal contacts are initially formed on silicon substrates by depositing cobalt, titanium or other metals and then annealing. Silicides, such as tungsten silicide ($WSi_2$), titanium silicide ($TiSi_2$), and cobalt silicide ($CoSi_2$) are used in the semiconductor industry to enhance signal propagation through MOS transistors and other conductive features of semiconductor devices. A conventional silicide process produces a low resistance silicide region on the top of an MOS transistor's polysilicon ("poly") gate electrode and interconnect. The suicide has a lower resistance than the underlying doped silicon or poly. As a result, signal propagation through the transistor (gate and interconnect) is enhanced.

While salicide formation may be desirable to reduce interconnect resistance in active devices, it is undesirable in applications where resistors are formed on the wafer. Both active and passive (i.e., capacitors and resistors) components are commonly found on semiconductor wafers. During the salicidation processes, salicide blocks are used to mask the resistor areas from the silicide film, thus maintaining the high resistance characteristics of the poly or other type of resistor.

Conventional salicide block processes deposit a relatively thick (e.g., 400 Angstrom) low temperature oxide (LTO) layer over the wafer. A block mask layer is then patterned to protect the selected resistor areas. Exposed areas are then etched using a timing etch to allow a thin (e.g., 100–200 A) oxide to remain on the active areas. Timed etches, however, are difficult to control from lot to lot, from chamber to chamber, and even across the width of the wafers. Likewise, control problems exist also in the salicide preclean step where typically an HF etch is performed prior to silicide formation to remove all oxide over the active areas. Namely, the salicide preclean operation has a low etch margin. Too long an overetch will remove block oxide from the masked areas and/or the field oxide areas while too short an over etch will cause incomplete salicidation.

Accordingly, it is desirable to provide a more effective salicide block process which has a greater process marginality. A desirable dielectric block mask process would allow all non-block area oxides to be removed in order to form a high quality salicide but would also allow oxide to remain on the resistor block area to prevent silicide formation. Further, a desirable dielectric block mask process would minimize removal of oxide from field oxide areas.

SUMMARY OF THE INVENTION

To achieve the foregoing, the present invention provides a salicide block process which uses $Si_3N_4$ or SiON as the block dielectric film. A block dielectric film is used in semiconductor processing to protect selected areas of the wafer from silicidation. The selected areas may include resistors. A first layer of oxide is formed on the resistor and a block dielectric film layer comprising SiON or $Si_3N_4$ is disposed on the oxide. A mask is patterned to allow etching to take place in the areas where silicide formation is desired. The oxide film serves as an etch stop layer during etching of the block dielectric film and also reduce the stress between SiN (SiON) and Si.

In one embodiment, the present invention provides a method of forming a block dielectric film to protect selected areas of a semiconductor wafer from a silicide process. Initially a low temperature oxide film is provided on the wafer. A block dielectric film comprising $Si_3N_4$ or SiON is disposed on the low temperature oxide film. A mask is formed over the selected areas, such as the resistor locations, and patterned so that the selected areas are covered by the mask during the etching operation which follows. During the etching operation of the unmasked areas, an etchant is selected so that the etching of the block dielectric film stops on the low temperature oxide film. The block mask is then removed and exposed portions of the oxide layer are removed in a salicide preclean operation. A silicide is then formed on the exposed areas of the semiconductor wafer, i.e., those areas comprising silicon and polysilicon.

In another embodiment, the etchant chemical for the block dielectric film is selected so that it has a selectivity of about 10:1 or greater $Si_3N_4$ or SiON to the oxide layer.

These and other features and advantages of the present invention are described below with reference to the drawings.

BRIEF DESCRIPTION OF THE DRAWINGS

FIGS. 1A–1C are diagrams depicting stages in the process of forming a salicide block in accordance with conventional technology.

FIG. 1D is a diagram illustrating example field oxide etching defects in accordance with conventional technology.

FIGS. 2A–2C are diagrams depicting stages in the process of forming a salicide block in accordance with one embodiment of the present invention.

FIG. 3 is a diagram illustrating an island resistor formed with a block dielectric film in accordance with one embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides an improved process for forming a salicide block to protect selected areas on the wafer, i.e., poly and island resistor areas, from silicide formation during a silicide step. The present invention provides a salicide block process which uses $Si_3N_4$ or SiON as the block dielectric film. A dielectric film block is used in semiconductor processing to protect selected areas of the wafer from silicidation. Here, in one embodiment, an oxide film is formed on the resistor and a block dielectric film comprising SiON or $Si_3N_4$ is deposited on the oxide film. A mask is patterned to allow etching to take place in the areas where silicide formation is desired. The oxide layer serves as an etch stop layer during etching of the block dielectric film.

FIGS. 1A–1C are diagrams depicting details of the steps involved in forming a salicide block and the salicide formation in accordance with conventional technology. FIG. 1A illustrates a stage in the conventional process following block oxide deposition and photoresist patterning. The conventional process begins, as illustrated in FIG. 1A, with a wafer having a poly resistor 102 formed on a silicon substrate 104. The poly resistor 102 is typically formed using chemical vapor deposition (CVD) techniques to deposit a layer of polysilicon. Subsequent doping of the polysilicon is optional, such as, for example, by ion implantation methods. Patterning and etching of the polysilicon layer follows, some of the patterned areas forming gates for transistors and some forming resistors. Thereafter, SiN spacers 106 are formed by CVD methods followed by anisotropic etching.

As further illustrated in FIG. 1A, a layer of low temperature oxide (LTO) block oxide 108 is then deposited by CVD techniques at temperatures preferably in the temperature range of 350 to 500 degrees C. Typically the layer is selected to be about 400 Angstroms thick in conventional processes. Such a relatively thick block oxide layer is desired to provide an adequate margin for the overetching that takes place prior to the silicide formation step, as explained further below.

Next, a block mask layer is deposited, patterned, and etched. Typically, the block mask layer comprises a photoresist material, formed by spin coating the wafer. The patterned block mask layer 110 is formed using photolithographic methods, developed, and etched so that the patterned block mask 110 covers the selected resistor areas but leaves exposed areas designated for later salicidation. As illustrated in FIG. 1A, the patterned block mask 110 is shown covering (i.e., protecting from later silicidation) the poly resistor 102 together with the overlying block oxide 108.

For illustration and comparison purposes, FIG. 1A also illustrates a conventional MOS transistor having a polysilicon gate 118, sidewall spacers 106, and source/drain regions 122. A field oxide region 124 is also shown, isolating the active device from other regions of the wafer. Source/drain junction 114 is located adjacent to the poly resistor and may also suffer from the junction leakage problems described above and later with respect to FIG. 1D when the conventional process is used.

Next, as illustrated in FIG. 1B, the exposed areas are etched using a timed etch to target a remaining oxide layer 108c of the active areas of 100 to 200 Angstroms. FIG. 1B illustrates a stage in the conventional process following the etching of the block oxide and the stripping of the photoresist. Due to the presence of the block mask 110, the block oxide 108b is unaffected by the etch. After etch, the photoresist block mask 110 is removed (i.e., stripped) in accordance with known methods in the industry.

A prerequisite for silicide formation is a silicon surface free of oxides. An HF salicide pre-clean is then performed to remove all of the oxide on the non-block poly and island areas. Thus, remaining block oxide 108c is removed. Note that in order to form a high quality salicide, all non-block area oxide needs to be removed. That is, all of the remaining oxide layer 108c, previously targeted at a thickness in the range of 100–200 Angstroms post etching, needs to be removed. Conversely, at least a thin layer of the block oxide 108b provided over the resistor area must remain after the preclean during the silicide step to prevent silicide formation. FIG. 1C illustrates a stage in the conventional process following the salicide preclean and silicide formation operations.

Next, as illustrated in FIG. 1C, salicidation occurs, such as through the use of a cobalt deposition and an RTA-1 anneal. The silicided areas 130 formed at the source drain regions 122 and the gate 118 reduce the interconnect resistance. The LTO block oxide 108b remaining on the selected resistor area, if of sufficient thickness, prevents salicide formation in those areas. Next, a selective salicide etch removes un-reactive cobalt.

As noted earlier, the conventional method presents several-problems. Timed block etches have difficulty in controlling the oxide removal amounts due to the absence of an etch stop layer. The timed block etch has difficulty in controlling the oxide removal from chamber to chamber, lot to lot, and from center to periphery of the wafer. Moreover, the non-uniformities in the deposited thickness of the oxide layer add to the non-uniformities of the remaining oxide layer 108c. Further, in order to remove all of the oxide layer during the HF salicide pre-clean, overetch is required. The overetch will result in a field oxide loss which needs to be minimized and precisely controlled.

FIG. 1D is a diagram illustrating junction leakage problems resulting from excess field oxide loss experienced in conventional methods. As illustrated, field oxide regions 140, 141 are arranged to isolate the MOS transistor 144. An excess salicide pre-clean step may result in too large of a recess in the field oxide 141 adjacent to the source/drain region 146. The problematic overetch recess is depicted in the circled region 148 as shown in FIG. 1D. The excess oxide recess may result in junction leakage from the local interconnect (LI) or borderless contact 150 around the corner of the trench formed by the excessive oxide etch. An excess oxide recess may also result in severe silicide encroachment that could cause junction leakage.

In order to solve these problems, embodiments of the present invention use two dielectric layers to block the resistor areas, the first layer comprising a low temperature oxide and the second layer, disposed on the first, comprising one of $Si_3N_4$ and SiON. The (first) oxide layer serves as an etch stop layer during the selective etching of the second layer and thus provides more precise control of the first oxide layer thickness remaining over the regions to be salicided as well as the field oxide regions. With this arrangement it is further possible to use endpoint detection to detect the change in the etching from the second dielectric layer (i.e., the $Si_3N_4$ or SiON block dielectric layer) to the oxide interface, thus improving process control even further.

FIGS. 2A–2C are diagrams illustrating stages in the process of forming a salicide block in accordance with one embodiment of the present invention. FIG. 2A illustrates a stage in the process according to one embodiment following block dielectric film deposition and photoresist patterning. The process begins with a block poly resistor 202 provided on a silicon substrate 204. The block poly resistor is formed in accordance with methods known to those of skill in the art, such as described above with respect to conventional dielectric blocks. For example, chemical vapor deposition techniques may be used to deposit a layer of polysilicon on the silicon substrate 204. Patterning and etching of the polysilicon layer follows in accordance with well-known processes to form a patterned block poly resistor as further illustrated in FIG. 2A. The patterning and etching will also result in the formation of the polysilicon gate 210 which is part of the MOS transistor 220 depicted. MOS transistor 220 comprises polysilicon gate 210 and source/drain regions 222. Field oxide region 224 serves to isolate the MOS transistor 220 from the resistor 202.

Spacers 205 are formed by depositing the spacer material layer over the patterned polysilicon followed by an anisotropic etch leaving spacers on each side of the polysilicon gate 210 and the poly resistor 202, as illustrated in FIG. 2A. Although the diagram depicts the spacers 205 comprising SiN, the invention is not intended to be so limited. The spacers may alternatively be formed according to well-known processes using oxide or any material which isolates the gate contact and the source/drain contacts.

Next, a thin block oxide layer 206 of low temperature oxide (LTO) or TEOS is formed. Preferably, the block oxide layer 206 has a thickness in the range of 50 to 100 Angstroms. The block oxide layer 206 is deposited by CVD techniques and, for the LTO, at temperatures preferably in the temperature range of 350 to 500 degrees C., more preferably at 400 degrees C. Alternatively, in one embodiment, a TEOS (Tetra Ethyl Ortho Silicate) oxide is used for the formation of the block oxide layer 206. It should be noted that the block oxide layer 206 may be formed on preexisting oxides on the various portions of the semiconductor wafer, for example, the active and passive devices. These oxides may in some cases be deposited on oxides 207 remaining from poly reoxidation steps and/or spacer liner oxidation steps. For example, a passivation oxide layer is typically provided prior to the deposition of SiN layers to protect the wafer surfaces from damage caused by the formation of the SiN layers. Namely, the oxide layer reduces SiN film induced stress related defects.

Once the block oxide layer 206 is formed on the substrate, a second dielectric layer 208, i.e., a block dielectric layer, is disposed on the block oxide layer 206. In accordance with the present embodiment, the second dielectric layer comprises silicon nitride ($Si_3N_4$) or silicon oxynitride (SiON). Plasma enhanced chemical vapor deposition methods are suitable for the formation of the second dielectric layer. For example, an AMAT Centura PECVD SiN deposition tool using $N_2$, $SiH_4$, $NH_3$ gases may be used for this purpose. Alternatively, both Novellus and AMAT provide suitable SiON deposition tools. Preferably the thickness of the block dielectric layer 208 ranges from about 100 to 500 Angstroms, more preferably about 300 to 400 Angstroms, and most preferably about 300 Angstroms.

Next, a block mask layer is deposited, patterned, and etched to form a patterned block mask 212. The block mask layer is formed by conventional methods, such as by spin coating the wafer. The block mask layer is patterned using photolithographic methods and developed and etched in accordance with known photolithographic methods and developed and etched in accordance with known methods in the art to form a patterned block mask 212. The patterned block mask 212 is arranged so that the block mask covers the selected areas such as the resistor 202 shown in FIG. 2A. As a result of the arrangement of the patterned block mask 212 on the wafer, selected areas of the block dielectric layer 208 ($Si_3N_4$ or SiON) are protected by the block mask 212 whereas other areas, such as those areas where contacts are located, are unmasked or, stated another way, exposed.

Next, the exposed areas of the block dielectric layer 208 are etched as illustrated in FIG. 2B. FIG. 2B illustrates a stage in the process according to one embodiment of the present invention following the etching of the block dielectric film and the stripping of the photoresist. Preferably an etchant chemical with a high selectivity of the block dielectric layer material ($Si_3N_4$ or SiON) to oxide is used. In one embodiment, the selectivity of the etchant chemical of the block dielectric layer ($Si_3N_4$ or SiON):oxide is greater than or equal to 10:1.

The use of two layers to serve as blocking layers allows the block oxide to be used as an etch stop layer, thus providing greater control to the etching process in comparison to conventional methods. Further, the use of two different layers in the dielectric block permits the use of endpoint detection techniques to determine when etching has been completed. Thus, in accordance with one embodiment of the present invention, endpoint detection is performed during the etching to determine the point at which etching is complete. The endpoint detection techniques, as utilized in embodiments of the present invention, provide greater control of the etching process and greater uniformity of the block oxide material remaining in the unmasked areas after etching.

Examples of suitable detection techniques include interferometry and spectral analysis of the etchant plasma. Typically, endpoint detection equipment is provided as part of the etching tool. For example, a LAM TCP9400PTX with spectrum spectrometer provides suitable detection capabilities.

Here, the deposited block oxide 206 has a formed thickness targeted in the range from about 50 to 100 Angstroms in comparison to the much greater thickness of the block oxide film according to conventional techniques (about 400 Angstroms, as discussed with reference to FIGS. 1A–C). Hence, any process variations in forming the film are expected to show less of a dimensional change for the thinner layer as compared to the thicker layer used in conventional process operations.

The photoresist mask 212 is then removed (i.e., stripped) and a salicide pre-clean is performed. As with the conventional methods, the salicide pre-clean may be performed using an HF etch, i.e., a wet etch, to remove all oxide on non-block poly and island areas. FIG. 2C illustrates a stage in the process according to one embodiment following the salicide preclean and salicide formation operations. Next, as illustrated in FIG. 2C, salicide formation occurs on salicided regions 230, such as through the use of a cobalt deposition and an RTA-1 anneal. Refractory materials and methods of depositing them for silicide formation are known in the industry. Methods of performing an RTA-1 anneal are also known to those of skill in the art and a further or complete description of these operations is believed unnecessary.

The presence of the second dielectric, i.e., the block dielectric layer 208, over the selected areas, i.e., the resistors, prevents salicide formation in those areas. Next, a selective salicide etch removes un-reactive cobalt or other silicide material used. The selective etching is well known to those of skill in the art and selectively etches the non-silicided metal layers, i.e. those layers which have not formed a silicide compound in the annealing step. Following the selective etching, only the salicided contacts remain, e.g., source/drain and gate contacts 230 as depicted in FIG. 2C.

FIG. 3 is a diagram illustrating the block dielectric layer surrounding an island resistor 302 in accordance with one embodiment of the present invention. The process technique of depositing a block oxide over the resistor followed by a second dielectric layer, i.e., a block dielectric comprising one of SiON or $Si_3N_4$, applies as well to island resistors. The N-type island resistor 302 is depicted formed in a p-well 304 of the silicon substrate adjacent to an example MOS transistor 320. The MOS transistor 320 is shown isolated from the N-type island resistor 302 by the field oxide region 324. As described above with respect to the poly resistor, both an oxide film 307 and a block dielectric layer 308 are deposited over the resistor. The diagram depicts a final configuration, following dielectric block formation and the subsequent etching steps described above with respect to FIGS. 2A–2C.

It has been shown that a dielectric block comprising two layers may be incorporated into the semiconductor fabrication process which provides precise control to minimize the etching of field oxide regions and increases process margins for the etching. By these methods, leakage is also reduced in the integrated circuit devices. The process techniques described herein may be particularly useful in mixed signal applications, where high valued poly or island resistors are needed.

Although the foregoing invention has been described in some detail for purposes of clarity of understanding, it will be apparent that certain changes and modifications may be practiced within the scope of the appended claims. Although one active device and one passive device are shown in many of the drawings, any number of each may be included on a semiconductor wafer. Accordingly, the present embodiments are to be considered as illustrative and not restrictive, and the invention is not to be limited to the details given herein, but may be modified within the scope and equivalents of the appended claims.

What is claimed is:

1. A method of forming a dielectric layer to protect selected areas of a semiconductor wafer from a silicide process, the method comprising:
    disposing an oxide film on the wafer;
    disposing a block dielectric layer comprising one of $Si_3N_4$ and SiON on the oxide film;
    forming a block mask over the wafer having the oxide film and block dielectric layer disposed on it, wherein the block mask is patterned to divide the mask into masked areas over the selected areas and unmasked areas left exposed, the selected areas including at least one resistor;
    etching the block dielectric layer in the unmasked areas to expose the oxide film, wherein the oxide film is used as an etch stop layer;
    removing said block mask;
    removing the exposed portions of the oxide film after removing said block mask to expose at least one silicon area; and
    forming a silicide on the exposed at least one silicon area of the semiconductor wafer.

2. The method as recited in claim 1, wherein the at least one silicon area is a polysilicon area.

3. The method as recited in claim 1, wherein the selected areas comprise at least one poly resistor.

4. The method as recited in claim 1, wherein the selected areas comprise at least one island resistor.

5. The method as recited in claim 1, wherein the oxide film ranges from about 50 to about 100 Angstroms in thickness.

6. The method as recited in claim 1, wherein the oxide film is one of a low temperature oxide film and TEOS oxide.

7. The method as recited in claim 1, wherein the block dielectric layer ranges from about 100 to about 500 Angstroms in thickness.

8. The method as recited in claim 1, wherein the block dielectric layer ranges from about 300 to 400 Angstroms in thickness.

9. The method as recited in claim 1, wherein the forming of a block mask over the selected areas of the semiconductor wafer comprises depositing a photoresist layer, and using a photolithographic method to pattern areas of the photoresist layer.

10. The method as recited in claim 1, wherein endpoint detection is used to determine the completion of the etching operation.

11. The method as recited in claim 10, wherein the endpoint detection detects a change in the interface between block dielectric layer and the oxide film.

12. The method as recited in claim 1, wherein a process tool uses optical emissions to detect a signal change indicating completion of the etching of the block dielectric layer.

13. The method as recited in claim 1, wherein the etching of the block dielectric layer is performed using a high selectivity etchant.

14. The method as recited in claim 1 wherein selectivity of an etchant for the block dielectric layer to the oxide film is about 10:1 or greater.

15. The method as recited in claim 1, wherein the oxide film ranges from about 50 to about 100 Angstroms in thickness and the block dielectric layer ranges from about 300 to 400 Angstroms in thickness.

16. A method of forming a semiconductor integrated circuit on a semiconductor substrate using a silicide blocking layer, the method comprising:
    forming an oxide layer on a resistor and a second region of the semiconductor substrate, wherein the resistor projects above the surface of the semiconductor substrate;
    forming a dielectric layer comprising one of $Si_3N_4$ and SiON to cover the oxide layer;
    creating a first mask to cover the resistor region and expose the second region;
    removing the dielectric layer exposed under the first mask, using the oxide layer as an etch stop layer to thereby create a hard mask;
    etching and removing the oxide layer in the second region, such that a silicon surface of the integrated circuit device is exposed and the resistor region is protected by the oxide and the hard mask; and
    forming a silicided region on the exposed silicon surface in the second region.

17. The method as recited in claim 16, wherein the silicon surface is at least one of a polysilicon gate and a source drain diffusion area for a transistor.

18. The method as recited in claim 16, wherein the oxide layer ranges from about 50 to about 100 Angstroms in thickness and the block dielectric layer ranges from about 300 to 400 Angstroms in thickness.

19. The method as recited in claim 16, wherein the first mask comprises a photoresist mask.

* * * * *